(12) United States Patent
Otani et al.

(10) Patent No.: US 6,703,955 B2
(45) Date of Patent: Mar. 9, 2004

(54) VARIABLE-OUTPUT-CHARACTERISTIC SEMICONDUCTOR INTEGRATED CIRCUIT DEVICE

(75) Inventors: Kenji Otani, Kyoto (JP); Ko Takemura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/417,106

(22) Filed: Apr. 17, 2003

(65) Prior Publication Data

US 2003/0197634 A1 Oct. 23, 2003

(30) Foreign Application Priority Data

Apr. 19, 2002 (JP) ........................................ 2002-117113

(51) Int. Cl.[7] ................................................ H03M 1/66
(52) U.S. Cl. ........................ 341/144; 341/136; 341/154
(58) Field of Search ................................. 341/144, 136, 341/145, 120, 154

(56) References Cited

U.S. PATENT DOCUMENTS 4,281,319 A * 7/1981 Roberts, Jr. ................. 341/136
4,491,825 A * 1/1985 Tuthill ......................... 341/145
5,469,164 A * 11/1995 Kemp ......................... 341/145
5,604,501 A * 2/1997 McPartland ................. 341/144
5,831,566 A * 11/1998 Ginetti ........................ 341/144
5,841,382 A * 11/1998 Walden et al. .............. 341/120
6,157,335 A * 12/2000 Suzuki et al. ............... 341/154
6,268,819 B1 * 7/2001 Fattaruso et al. ........... 341/154
6,469,647 B1 * 10/2002 Kinugasa et al. ........... 341/145

FOREIGN PATENT DOCUMENTS

JP          09-330135 A1         12/1997

* cited by examiner

Primary Examiner—Jean Jeanglaude
(74) Attorney, Agent, or Firm—Morgan, Lewis & Bockius LLP

(57) ABSTRACT

In a semiconductor integrated circuit device, a reference voltage is connected to one input terminal of an amplifier, and the voltage appearing on the output side is divided by a plurality of resistors and is negatively fed back to the other input terminal of the amplifier to control the output voltage. Here, according to an input code fed to the semiconductor integrated circuit device, switching devices are turned on or off correspondingly to vary how the resistors are connected and thereby control the voltage division factor. Thus, the output voltage is set according to the input code.

10 Claims, 3 Drawing Sheets

VARIABLE-OUTPUT-CHARACTERISTIC SEMICONDUCTOR INTEGRATED CIRCUIT DEVICE

BACKGROUND OF THE INVENTION

1. Field of the Invention

The present invention relates to a semiconductor integrated circuit device of which an output characteristic is variable according to a code fed thereto.

2. Description of the Prior Art

With the diversification of electronic products and needs for them, production of electronic products is shifting from conventional small-variety large-quantity production to large-variety small-quantity production. To cope with this trend in increasing market competition, suppliers of semiconductor integrated circuit devices are required to supply product manufacturers or the like with a large variety of semiconductor integrated circuit devices with short delivery times.

For suppliers, however, developing and fabricating such semiconductor integrated circuit devices is inefficient, contributing greatly to increased costs. For this reason, to cope with the aforementioned trend, suppliers of semiconductor integrated circuit devices in the field of logic circuits, in particular ASICs including gate arrays, are supplying their users such as product manufacturers with field-programmable gate arrays and programmable logic devices (PLDs) that permit the users to modify the configuration of the circuits incorporated therein within certain limits when they manufacture products.

As described above, such programmable semiconductor integrated circuit devices are composed of logic circuits, and are used with their logic configuration appropriately modified. Thus, with these devices, it is difficult to vary a characteristic of an analog output, such as the amplification factor or the output voltage. To overcome this, Japanese Patent Application Laid-Open No. H9-330135 proposes an operation characteristic correction device in which an analog output is kept constant according to the value of a control register. With this device, however, even if a wrong value is set, it is difficult to recognize it, and it is impossible to supply the device as semiconductor integrated circuit devices of a single type but with different specifications to a plurality of users.

SUMMARY OF THE INVENTION

An object of the present invention is to provide a semiconductor integrated circuit device that, with a single type of it, can yield an output with different characteristics desired by different users simply by being fed with one of codes assigned to different characteristics and that is provided with an output terminal that permits the checking of whether the correct code has been entered or not.

To achieve the above object, according to one aspect of the present invention, a semiconductor integrated circuit device is provided with a control circuit that decodes and outputs a predetermined portion of an input code as a driving signal; a switching circuit composed of a switching device that is driven by the driving signal; and an analog circuit in which connection of an internal device is varied according to the state of the switching device so that the analog circuit outputs an output signal with an electrical characteristic according to the input code.

The input code may consist of a characteristic setting code that corresponds to the predetermined portion of the input code and that determines the electrical characteristic and a user code that is assigned uniquely to each user of the semiconductor integrated circuit device.

The switching device may be a MOS transistor.

A registration code corresponding to the user code may be set previously in the semiconductor integrated circuit device. In this case, the semiconductor integrated circuit device is further provided with an error output terminal by way of which a signal indicating an abnormality is output when the user code entered does not agree with the registration code.

According to another aspect of the present invention, a semiconductor integrated circuit device is provided with: a control circuit that decodes and outputs a predetermined portion of an input code as a driving signal; a switching circuit comprising a plurality of switching devices that are driven by the driving signal; a power supply circuit in which connection of an internal device is varied according to the states of the switching devices so that the power supply circuit outputs an output voltage selected uniquely from among a plurality of voltages according to the input code; and an internal analog circuit that can use as a reference voltage one of the plurality of voltages output from the power supply circuit and of which an output characteristic is varied according to the uniquely selected output voltage.

The input code may consist of a characteristic setting code that corresponds to the predetermined portion of the input code and that determines the electrical characteristic and a user code that is assigned uniquely to each user of the semiconductor integrated circuit device.

The power supply circuit may control the output voltage thereof by feeding a predetermined voltage to one input terminal of an amplifier, dividing the voltage on the output side of the amplifier with a plurality of resistors, and feeding the resulting divided voltage negatively back to the other input terminal of the amplifier.

A registration code corresponding to the user code may be set previously in the semiconductor integrated circuit device. In this case, the semiconductor integrated circuit device is further provided with an error output terminal by way of which a signal indicating an abnormality is output when the user code entered does not agree with the registration code.

The plurality of resistors, except the one always connected to the output side of the amplifier and the one always connected to ground, may correspond one to one to the plurality of switching devices. In this case, as one of the switching devices is driven, the ground-side terminal of the resistor corresponding to that one of the switching devices is connected to ground.

The switching devices may be MOS transistors.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
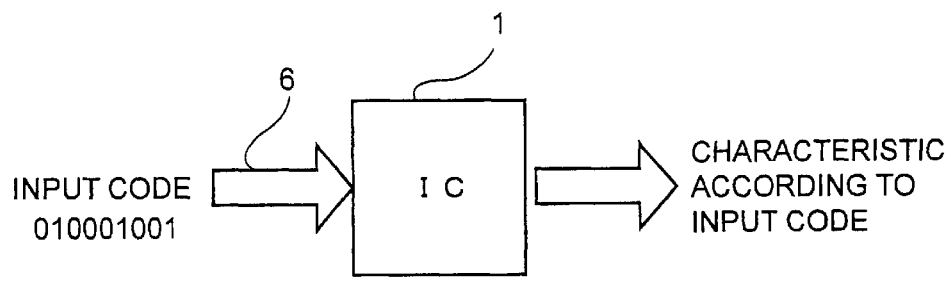
FIG. 1 is a block diagram illustrating the basic configuration according to the invention.

Hereinafter, embodiments of the present invention will be described with reference to the drawings. FIG. 1 is a block diagram illustrating the basic configuration according to the invention, and FIG. 2 is a block diagram illustrating the basic configuration of an analog output circuit.

In the block diagram of FIG. 1, when, for example, an input code in the form of a binary number 010001001 is fed from an unillustrated control device to a semiconductor integrated circuit device 1 according to the invention, it yields a characteristic that corresponds to the input code. Here, the input code 010001001 is composed of a user code, which the supplier of the semiconductor integrated circuit device gives to the user who requested that particular characteristic, and a characteristic setting code. The same input code is never given to another user who requests the same characteristic or to another user who requests a different characteristic.

Figure 2:
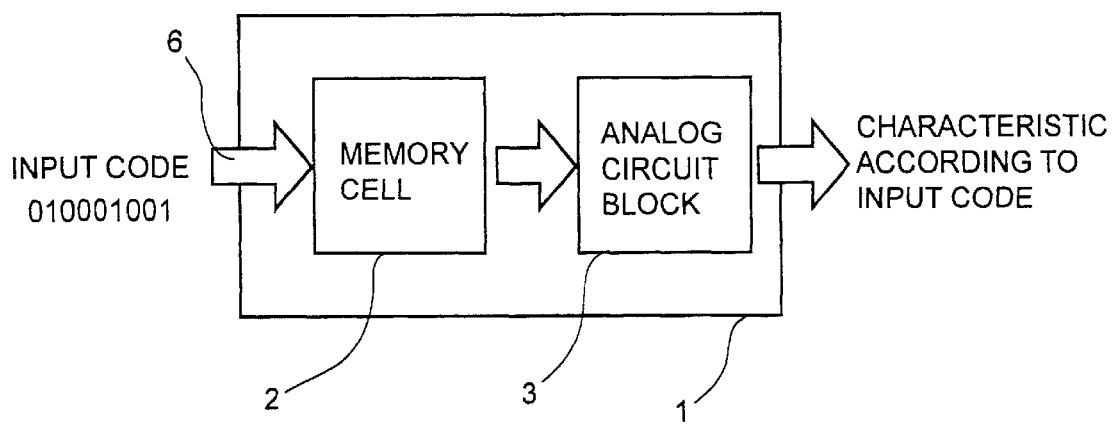
FIG. 2 is a block diagram illustrating the basic configuration of an analog output circuit.

In FIG. 2, the aforementioned input code is fed to a memory cell 2 provided within the semiconductor integrated circuit device 1, and the configuration or internal connection of an analog circuit block 3 acting as an output circuit is accordingly changed to yield an analog characteristic corresponding to the input code.

Figure 3:
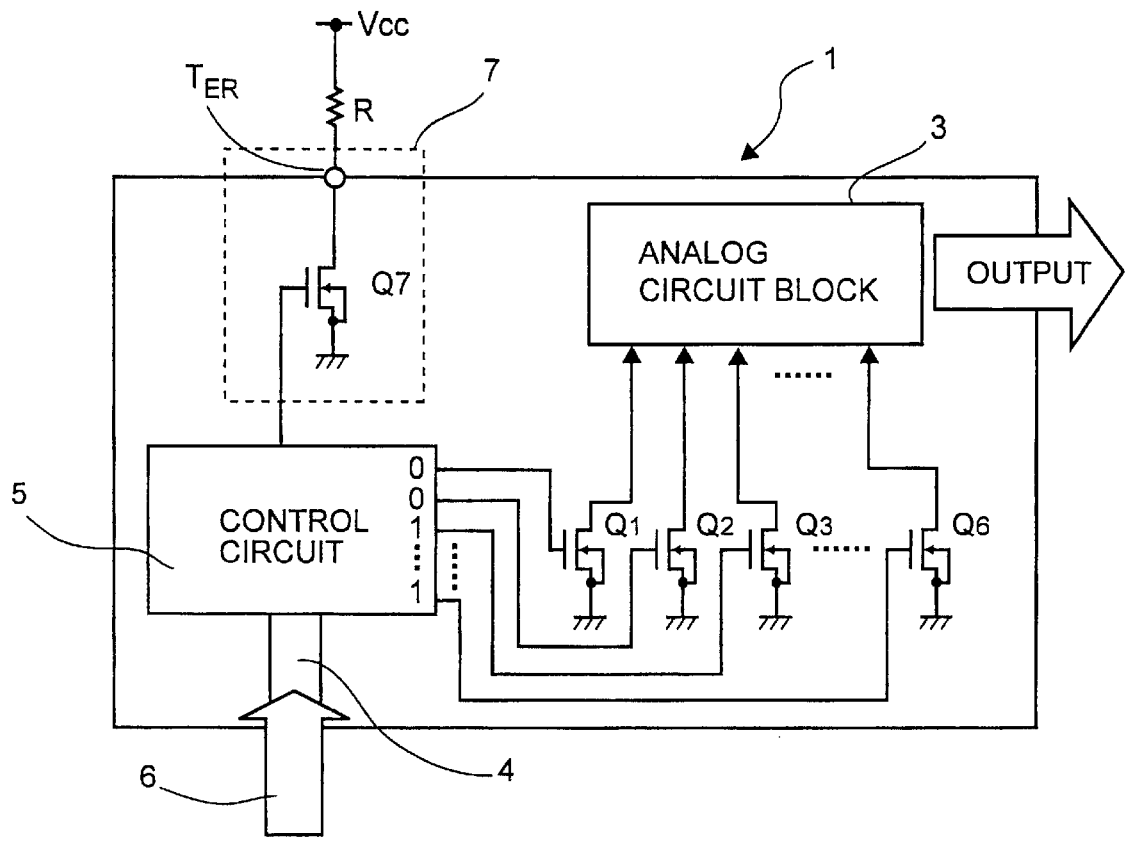
FIG. 3 is a diagram showing a circuit configuration for varying an analog characteristic by turning MOS transistors on and off.

FIG. 3 shows a circuit configuration in which an analog characteristic is varied by turning MOS transistors on and off. An input code 6 is fed in as serial data. The input code 6 represents the code that is given to the user of the semiconductor integrated circuit device 1 of the invention, and is composed by combining together a user code that identifies the user and a characteristic setting code according to which a characteristic of the semiconductor integrated circuit device 1 is varied. The semiconductor integrated circuit device 1 is provided with a serial interface 4, which may be, for example, of a type as used in personal computers or of a device-specific type.

Here, a control circuit 5 decodes the user code included in the input code 6 fed in from outside through the serial interface 4, and is furnished with the function of serial-to-parallel conversion so as to convert the characteristic setting code included in the input code 6 into parallel signals. Q1 to Q6 represent NMOS transistors, and their drains are connected to unillustrated devices provided in the analog circuit block 3.

The control circuit 5 first decodes only the user code portion of the input code 6 entered by the user, and, if the result does not agree with a registration code that is set previously in the semiconductor integrated circuit device the user is going to use, the control circuit 5 sets an error flag, and feeds its output to the gate of an NMOS transistor Q7 provided in an error output circuit 7. The transistor Q7 is connected to an error output terminal $T_{ER}$ of the semiconductor integrated circuit device 1. To this error output terminal $T_{ER}$, an external pull-up resistor R is connected so that, when the error flag causes the transistor Q7 to turn on, the potential at the error output terminal $T_{ER}$ turns to a low level, and thereby indicates that the entered user code is wrong. In this case, the control circuit 5 does not decode the characteristic setting code entered subsequently to the user code, and therefore the characteristic setting code brings about no change in the characteristics of the semiconductor integrated circuit device 1.

By contrast, if the user code decoded by the control circuit 5 agrees with the registration code that is set previously in the semiconductor integrated circuit device the user is going to use, the control circuit 5 does not set the error flag, and therefore the transistor Q7 does not turn on. In this case, the control circuit 5 takes in the characteristic setting code entered subsequently, and operates in the following manner.

Let the characteristic setting code included in the input code 6 given to the user of the semiconductor integrated circuit device 1 of the invention be, for example, 001001. When this characteristic setting code is fed in through the serial interface 4, the control circuit 5 converts the characteristic setting code into parallel signals and outputs them, feeding "0" (a low level) to the gates of the transistors Q1, Q2, Q4, and Q5 and "1" (a high level) to the gates of the transistors Q3 and Q6. The transistors Q3 and Q6, which receive "1" at their gates, are turned on, and connect the unillustrated devices provided in the analog circuit block 3 to ground. The transistors Q1, Q2, Q4, and Q5, which receive "0" at their gates, are turned off, and the unillustrated devices provided in the analog circuit block 3 is fed with, for example, a level equal to the supply voltage Vcc, producing a circuit configuration and a characteristic that are different from those produced by another characteristic setting code. In this way, the connection of the unillustrated devices provided in the analog circuit block 3 is changed, and as a result the analog circuit block 3 yields a different circuit characteristic.

In the above description, the characteristic setting code fed in from outside is converted directly into parallel signals, and then signals "0" and "1" are fed to the transistors corresponding to the individual bits of the characteristic setting code. Alternatively, the characteristic setting code may be decoded so that, for example, when it is 000001, 000010, or 000011, the transistor Q1, Q2, or Q3 respectively is turned on.

As described above, the code previously set in the semiconductor integrated circuit device 1 is verified against the user code entered, and, only when they agree, a characteristic is varied in the manner described above. Thus, another user having another user code or an unspecified user having no user code cannot use the characteristic setting function of the semiconductor integrated circuit device 1. Thus, it is possible to simultaneously achieve security.

Figure 4:
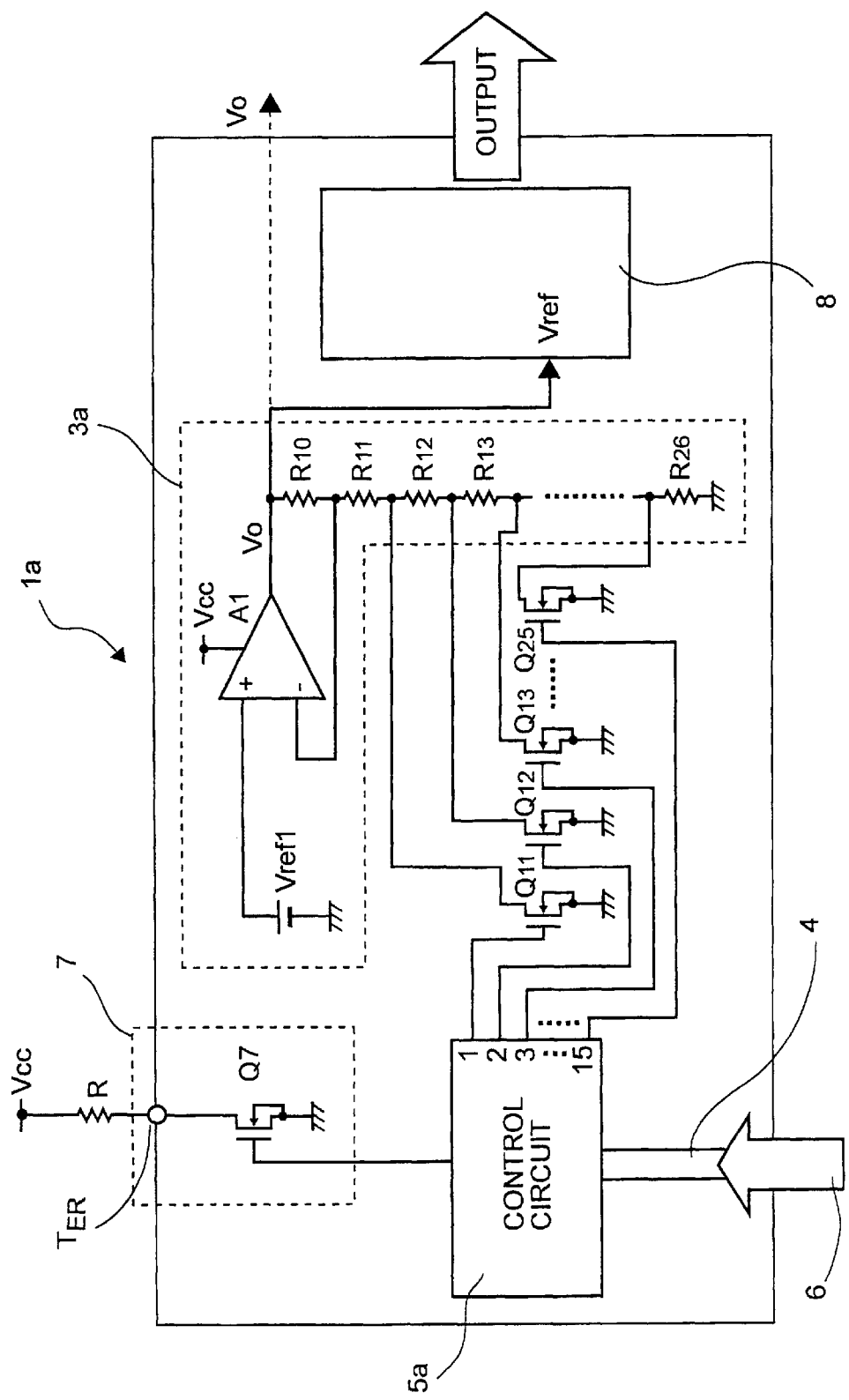
FIG. 4 is a diagram showing an example in which the present invention is applied to a variable-output-voltage circuit.

FIG. 4 shows an example in which the present invention is applied to a variable-output-voltage circuit. An input code 6 from outside is fed through a serial interface 4 to a control circuit 5a. Here, the user code included in the input code 6 to identify the user is, as described earlier with reference to FIG. 3, verified by the control circuit 5a. If it does not agree with the registration code previously set in the semiconductor integrated circuit device 1a, the control circuit 5a outputs a signal to turn on an NMOS transistor Q7 provided in an error output circuit 7, and simultaneously the potential at an error output terminal $T_{ER}$ turns to a low level. Thus, the characteristic setting code subsequently fed in is not dealt with.

If the user code agrees with the registration code previously set in the semiconductor integrated circuit device 1a, the characteristic setting code subsequently fed in through the serial interface 4 is dealt with. For example, when the characteristic setting code is a four-digit binary number 0001, it is decoded by the control circuit 5a, and a signal is fed to the gate of an NMOS transistor Q11, which corresponds to one in decimal notation, to turn only the transistor Q11 on. Likewise, when the characteristic setting code is 0010 in binary notation, only an NMOS transistor Q12, which corresponds to two in decimal notation, is turned on, and, when the characteristic setting code is 0011 in binary notation, only an NMOS transistor Q13, which corresponds to three in decimal notation, is turned on.

In this example, as an example of an analog circuit of which an output characteristic is varied according to the input code, a power supply circuit 3a is used. This power supply circuit 3a employs an amplifier A1 of which the non-inverting input terminal is connected to a reference voltage Vref1. The output voltage $V_o$ of the amplifier A1 is divided by resistors R10 to R26 connected in series between the output side of the amplifier A1 and ground, and is then fed back to the inverting input terminal of the amplifier A1. The voltage division factor by which the output voltage $V_o$ is divided is determined by the resistance of the resistor R10 and the resistance of the resistors R11 to R26 connected to the lower end of the resistor R10. When one of the transistors is turned on, it leads to ground the lower end of the resistor with the same number.

Now, suppose that the characteristic setting code, for example 0001, included in the input code 6 given to the user of the semiconductor integrated circuit device of the invention is fed through the serial interface 4 to the control circuit 5a. Then, the characteristic setting code is decoded and output, feeding "1" (a high level) to the gate of the transistor Q11 and "0" (a low level) to the gates of the other transistors. As a result, the transistor Q11 is turned on, and leads the lower end of the resistor R11 to ground. In this circuit configuration, the voltage fed back to the inverting input terminal of the amplifier A1 is $V_o \times (R11+R12+ \ldots +R26)/(R10+(R11+R12+ \ldots +R26))$. In this particular case, since the lower end of the resistor R11 is grounded, the resistor R12 and those connected below it have zero resistance, and hence the above formula is reduced to $V_o \times R11/(R10+R11)$. Likewise, when only the transistor Q12 is turned on, the lower end of the resistor R12 is grounded, and therefore the voltage fed back to the amplifier A1 is $V_o \times (R11+R12)/(R10+R11+R12)$. In this way, the voltage division factor is varied.

As the voltage division factor is varied in this way, the output voltage $V_o$, which is given by the formula below, also varies.

$$V_o = Vref1 \times (R10+R11+ \ldots +R26)/(R11+R12+ \ldots R26)$$

As described above, this semiconductor integrated circuit device 1a varies its output voltage $V_o$ according to the characteristic setting code fed thereto. Thus, it can be used as a power supply circuit that outputs an output voltage $V_o$ according to the characteristic setting code fed thereto, and, as shown in FIG. 4, by using the power supply circuit to supply a reference voltage Vref to an analog circuit 8 provided in the semiconductor integrated circuit device 1a, it is possible to vary the reference voltage Vref according to the characteristic setting code fed to the semiconductor integrated circuit device 1a. This makes it possible to vary an output characteristic of an analog circuit having any function, such as the analog circuit 8.

In the examples described above, the characteristic setting code fed in is a six- or four-digit binary number. It is also possible, however, to use a number consisting of any other number of digits, or add another decoder to accept a decimal number. In the examples described above, NMOS transistors are used as switching devices. It is also possible, however, to use instead PMOS transistors, CMOS transistors, or bypolar transistors.

As described above, a variable-characteristic semiconductor integrated circuit device according to the invention can be used, with a single type of it, to yield a characteristic selected from among a plurality of characteristics. Thus, it is possible to supply a single user or a plurality of users who desire different characteristics with a single semiconductor integrated circuit device, with different codes assigned to different characteristics. This helps simplify the development and fabrication of the semiconductor integrated circuit device, and also helps reduce costs.

Moreover, by providing the semiconductor integrated circuit device with an error output terminal, it is possible to check whether a predetermined code has been correctly entered or not. Thus, it is easy to configure the control circuit of the semiconductor integrated circuit device to reject any further entry of codes when wrong codes have been entered a predetermined number of times consecutively. This helps prevent another user from using a particular function and thereby enhance security.

Furthermore, even when a given user desires to use a plurality of characteristics, the supplier can supply the user with as many codes as the user desires, and it is not necessary to use a plurality of types of semiconductor integrated circuit device. Moreover, a user is given only the codes that the user needs. Thus, by increasing the number of digits or the like of the code, it is possible to make it difficult for another user to know the contents and thereby further enhance security.

What is claimed is:

1. A semiconductor integrated circuit device comprising:
   a control circuit that decodes and outputs a predetermined portion of an input code as a driving signal;
   a switching circuit comprising a switching device that is driven by said driving signal; and
   an analog circuit in which connection of an internal device is varied according to a state of said switching device so that said analog circuit outputs an output signal with an electrical characteristic according to said input code.

2. A semiconductor integrated circuit device as claimed in claim 1:
   wherein said input code consists of a characteristic setting code that corresponds to said predetermined portion of said input code and that determines said electrical characteristic and a user code that is assigned uniquely to each user of said semiconductor integrated circuit device.

3. A semiconductor integrated circuit device as claimed in claim 1,
   wherein said switching device is a MOS transistor.

4. A semiconductor integrated circuit device as claimed in claim 2,
   wherein a registration code corresponding to said user code is set previously in said semiconductor integrated circuit device, and said semiconductor integrated circuit device further comprises an error output terminal by way of which a signal indicating an abnormality is output when said user code entered does not agree with said registration code.

5. A semiconductor integrated circuit device comprising:
   a control circuit that decodes and outputs a predetermined portion of an input code as a driving signal;
   a switching circuit comprising a plurality of switching devices that are driven by said driving signal;
   a power supply circuit in which connection of an internal device is varied according to states of said switching devices so that said power supply circuit outputs an output voltage selected uniquely from among a plurality of voltages according to said input code; and an internal analog circuit that can use as a reference voltage one of said plurality of voltages output from said power supply circuit and of which an output characteristic is varied according to said uniquely selected output voltage.

6. A semiconductor integrated circuit device as claimed in claim 5, wherein said input code consists of a characteristic setting code that corresponds to said predetermined portion of said input code and that determines said electrical characteristic and a user code that is assigned uniquely to each user of said semiconductor integrated circuit device.

7. A semiconductor integrated circuit device as claimed in claim 5, wherein said power supply circuit controls the output voltage thereof by feeding a predetermined voltage to one input terminal of an amplifier, dividing a voltage on an output side of said amplifier with a plurality of resistors, and feeding a resulting divided voltage negatively back to another input terminal of said amplifier.

8. A semiconductor integrated circuit device as claimed in claim 6, wherein a registration code corresponding to said user code is set previously in said semiconductor integrated circuit device, and said semiconductor integrated circuit device further comprises an error output terminal by way of which a signal indicating an abnormality is output when said user code entered does not agree with said registration code.

9. A semiconductor integrated circuit device as claimed in claim 7, wherein said plurality of resistors, except the resistor always connected to the output side of said amplifier and the resistor always connected to ground, correspond one to one to said plurality of switching devices, and, as one of said switching devices is driven, a ground-side terminal of the resistor corresponding to said one of the switching devices is connected to ground.

10. A semiconductor integrated circuit device as claimed in claim 9, wherein said switching devices are MOS transistors.

* * * * *